(12) United States Patent
Liao

(10) Patent No.: US 7,029,295 B2
(45) Date of Patent: Apr. 18, 2006

(54) LAND GRID ARRAY CONNECTOR ASSEMBLY WITH READILY REMOVABLE PICK-UP CAP

(75) Inventor: Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/867,933

(22) Filed: Jun. 14, 2004

(65) Prior Publication Data

US 2004/0266245 A1  Dec. 30, 2004

(30) Foreign Application Priority Data

Jun. 13, 2003  (TW)  .............................. 92210869 U

(51) Int. Cl.
*H01R 13/44* (2006.01)

(52) U.S. Cl. ...................................... 439/135; 439/940

(58) Field of Classification Search ................ 439/940, 439/135, 70, 71, 41, 136; 174/66, 138 F
See application file for complete search history.

(56) References Cited

U.S. PATENT DOCUMENTS

| 4,601,525 | A | * | 7/1986 | Kandybowski | ............. 439/329 |
|---|---|---|---|---|---|
| 5,819,404 | A | | 10/1998 | Whiting | |
| 6,042,412 | A | * | 3/2000 | Murr | ........................... 439/331 |
| 6,413,111 | B1 | | 7/2002 | Pickles et al. | |
| 6,478,588 | B1 | | 11/2002 | Howell et al. | |
| 6,533,592 | B1 | | 3/2003 | Chen | |
| 6,547,609 | B1 | | 4/2003 | Howell | |
| 6,561,825 | B1 | | 5/2003 | McHugh | |
| 6,572,383 | B1 | | 6/2003 | Yu | |
| 6,753,474 | B1 | * | 6/2004 | Trout | ........................... 174/66 |
| 6,796,805 | B1 | * | 9/2004 | Murr | ........................... 439/7.1 |
| 6,827,586 | B1 | * | 12/2004 | Noda et al. | ................... 439/71 |
| 6,846,190 | B1 | * | 1/2005 | Abe et al. | ................... 439/135 |

* cited by examiner

*Primary Examiner*—Alexander Gilman
(74) *Attorney, Agent, or Firm*—Wei Te Chung

(57) ABSTRACT

An LGA connector assembly (1) includes an LGA connector (2) and a generally rectangular pick-up cap (3). The connector includes an insulative housing (21), a plurality contacts (22) received therein, and a metal clip (25) mounted on the housing. The housing defines a cavity (210) for receiving an LGA central processing unit (CPU) therein. The clip is disposed on the housing to press the CPU upon the contacts. The pick-up cap has a generally rectangular planar body (30), a trapezoidal lip (304) formed at a middle of a front end of the body, and a plurality of clasps (307, 308) disposed at two opposite sides thereof. A space is formed between the lip and the clip when the pick-up cap mounted onto the connector, for facilitating operating during tetachment of the pick-up cap from the connector.

6 Claims, 4 Drawing Sheets

LAND GRID ARRAY CONNECTOR ASSEMBLY WITH READILY REMOVABLE PICK-UP CAP

CROSS-REFERENCE TO RELATED APPLICATION

The present invention is related to a co-pending U.S. patent application filed on Jul. 3, 2003, entitled "LAND GRID ARRAY CONNECTOR ASSEMBLY WITH PICK UP CAP," invented by Fang-Jwu Liao, and assigned to the same assignee as the present invention.

BACKGROUND OF THE INVENTION

1. Field of the Invention

The present invention relates to a land grid array (LGA) connector assembly which comprises an LGA connector and a pick-up cap mounted on the LGA connector for providing a plane surface to be engaged by a vacuum suction device, whereby the LGA connector assembly can be moved onto a circuit substrate such as a printed circuit board (PCB) on which the LGA connector is to be mounted.

2. Description of the Prior Art

On many production lines, electronic components such as land grid array (LGA) connectors are accurately positioned on circuit substrates such as printed circuit boards (PCBs) by means of vacuum suction devices. Such an LGA connector typically comprises an insulative housing, a plurality of electrical contacts received in the housing, a metal clip pivotably mounted to an end of the housing, and a lever pivotably mounted to an opposite end of the housing for engaging with the clip. The clip has a generally rectangular window in a middle thereof. Each contact has a first contact portion protruding outwardly from an upper surface of the housing, for electrically connecting with a corresponding metal contact pad of an electronic package such as an LGA central processing unit (CPU) that is received in LGA connector. Because of this configuration of the LGA connector, a pick-up cap has to be pre-attached on a top portion of the housing. The pick-up cap has a generally rectangular body. Typically, a plurality of latches depends perpendicularly from sides of the body. The latches snappingly engage with corresponding sidewalls of the clip, thereby mounting the pick-up cap onto the LGA connector. The pick-up cap has a plane top surface exposed through the window. A vacuum suction device can accordingly engage on the top surface of the pick-up cap, in order to reliably move the LGA connector and accurately position it onto the PCB.

However, during attachment of the pick-up cap onto the LGA connector or detachment of the pick-up cap from the LGA connector, the latches of the pick-up cap are liable to hit the first contact portions of some of the contacts and displace those contacts. The displaced contacts may not reliably contact the corresponding metal contact pads of the CPU, and electrical connection between the CPU and the PCB is liable to be disrupted. In addition, because the latches depend perpendicularly from sides of the body, it is difficult for a user to manually release the pick-up cap upwardly from the LGA connector when the pick-up cap needs to be detached from the LGA connector.

Thus, there is a need to provide a new electrical connector assembly with a pick-up cap that overcomes the above-mentioned problems.

SUMMARY OF THE INVENTION

Accordingly, an object of the present invention is to provide a land grid array (LGA) connector assembly which has an LGA connector and a pick-up cap mounted onto the connector, wherein the pick-up cap is configured to facilitate detachment of the pick-up cap from the connector.

To fulfill the above-mentioned object, an LGA connector assembly in accordance with a preferred embodiment comprises an LGA connector and a generally rectangular pick-up cap mounted onto the connector. The connector comprises an insulative housing, a plurality contacts received therein, and a metal clip mounted on the housing. The housing defines a generally rectangular cavity for receiving an electronic package such as an LGA central processing unit (CPU) therein. A multiplicity of terminal-passages is defined in a portion of the housing around the cavity, for receiving a corresponding number of the contacts therein. The clip is disposed on the housing to press the CPU upon the contacts. The pick-up cap has a generally rectangular planar body, a trapezoidal lip formed at a middle of a front end of the body, and a plurality of clasps disposed at two opposite sides thereof. The clasps snappingly clasp edges of the clip of the connector, thereby securely mounting the pick-up cap onto the connector. The lip is raised relative to the clip when the pick-up cap mounted onto the connector, for facilitating detachment of the pick-up cap from the connector.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
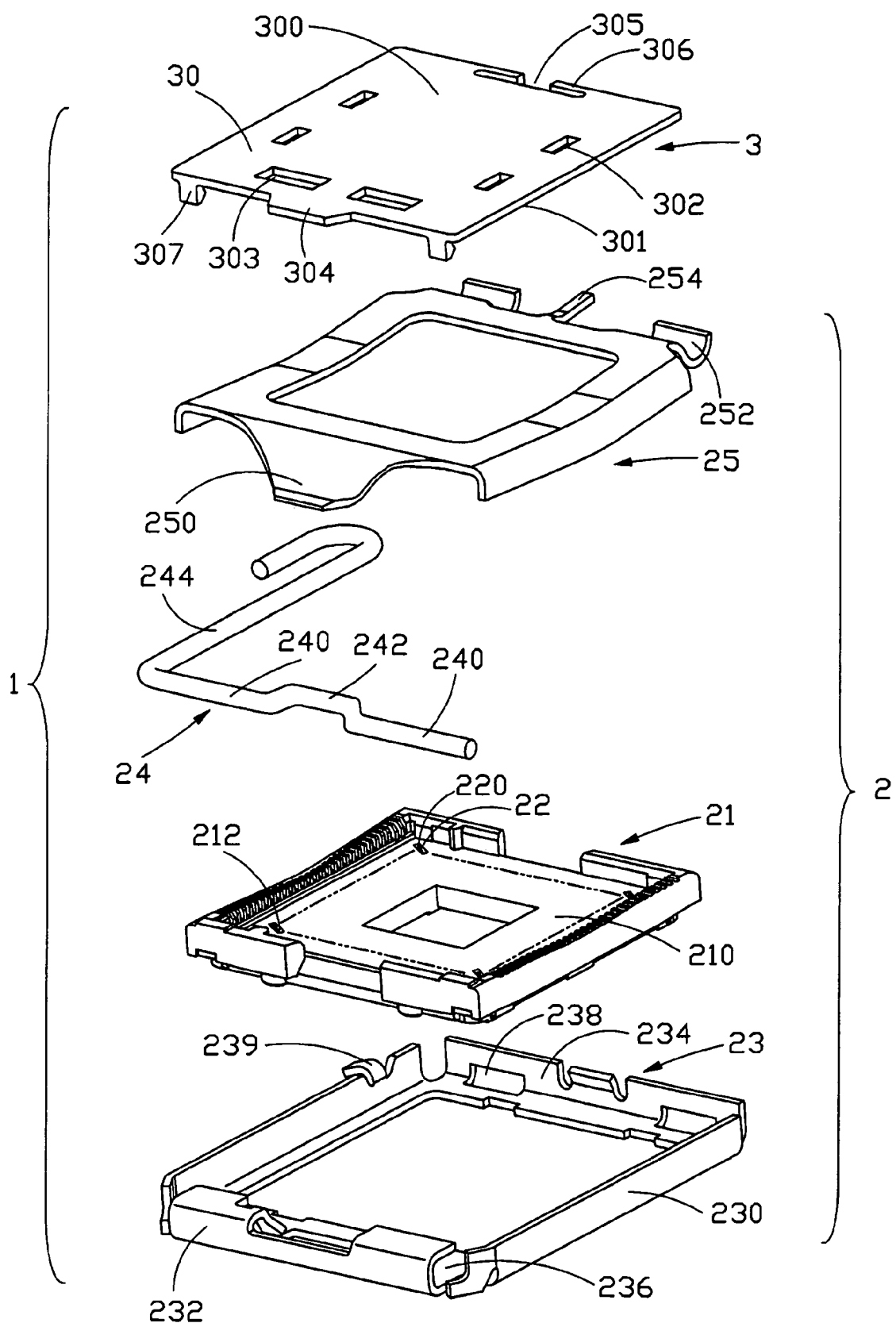
FIG. 1 is an exploded, isometric view of an electrical connector assembly of the present invention, the electrical connector assembly comprising an electrical connector and a pick-up cap mountable onto the connector.

FIG. 1 is an exploded, isometric view of a land grid array (LGA) connector assembly 1 in accordance with the preferred embodiment of the present invention. The LGA connector assembly 1 comprises an LGA connector 2 and a gengerally rectangular pick-up cap 3. The pick-up cap 3 is mounted onto the connector 2, for providing a plane surface to be engaged by a vacuum suction device. The LGA connector assembly 1 can thereby be moved onto a circuit substrate, such as a printed circuit board (PCB) (not shown), on which the connector 2 is to be mounted.

The connector 2 comprises a generally rectangular insulative housing 21, a multiplicity of contacts 22 received in the housing 21, a metal stiffener 23 partly covering and reinforcing the housing 21, a lever 24 pivotably received in an end of the stiffener 23, and a metal clip 25 pivotably mounted to an opposite end of the stiffener 23 for engaging with the lever 24.

The housing 21 defines a generally rectangular cavity 210 in a middle thereof. The cavity 210 is used for receiving an electronic package such as an LGA central processing unit (CPU) (not shown) therein. A multiplicity of terminal-passages 212 is defined in a portion of the housing 21 under the cavity 210, the terminal-passages 212 receiving a corresponding number of the contacts 22 therein respectively. Each contact 22 has a first contacting portion 220 protruding outwardly from a top face of said portion of the housing 21, for resiliently electrically contacting a corresponding pad of the CPU.

The stiffener 23 comprises a pair of lateral sides 230 each having an L-shaped cross-section, a front end 232 having a U-shaped cross-section, and a rear end 234 having an L-shaped cross-section. The housing 21 is fittingly received in the stiffener 23. An elongate chamber 236 is defined in the front end 232 of the stiffener 23. A pair of spaced slots 238 is defined in the rear end 234 of the stiffener 23. An ear 239 extends arcuately from an edge of one of the lateral sides 230 of the stiffener 23.

The lever 24 comprises a pair of locating portions 240 pivotably received in the chamber 236 of the stiffener 23, an offset actuating portion 242 between the locating portions 240, and an operating portion 244 extending perpendicularly from an end of one of the locating portions 240. The operating portion 244 is disposed outside of the stiffener 23. When oriented at a horizontal position parallel to the housing 21, the operating portion 244 engages with the ear 239.

The clip 25 comprises an engaging portion 250 extending arcuately from an end thereof, a pair of spaced securing portions 252 extending arcuately from an opposite end thereof and pivotably received in the slots 238 of the stiffener 23, and a tail 254 between the securing portions 252. When the clip 25 is oriented at a horizontal position parallel to the housing 21, the engaging portion 250 of the clip 25 is engaged by the actuating portion 242 of the lever 24, and the clip 25 thereby presses the CPU on the contacts 22. When the clip 25 is oriented at a position perpendicular to the housing 21, the tail 254 abuts against the stiffener 23 to prevent the clip 25 from being over-rotated.

The pick-up cap 3 has a generally rectangular planar body 30. The planar body 30 comprises a plane top surface 300, and a bottom surface 301 opposite to the top surface 300. Two generally rectangular first holes 302 are defined in each of opposite lateral sides of the planar body 30. Two generally rectangular second holes 303 are defined in a front end of the planar body 30. Each of the second holes 303 is larger than each of the first holes 302. A trapezoidal lip 304 is coplanarly formed at a middle of the front end of the planar body 30, for facilitating a user operating the pick-up cap 3 during detachment of the pick-up cap 3 from the connector 2. A generally T-shaped channel 305 is defined in a middle of an opposite rear end of the planar body 30, thereby forming a pair of opposing arms 306.

Figure 2:
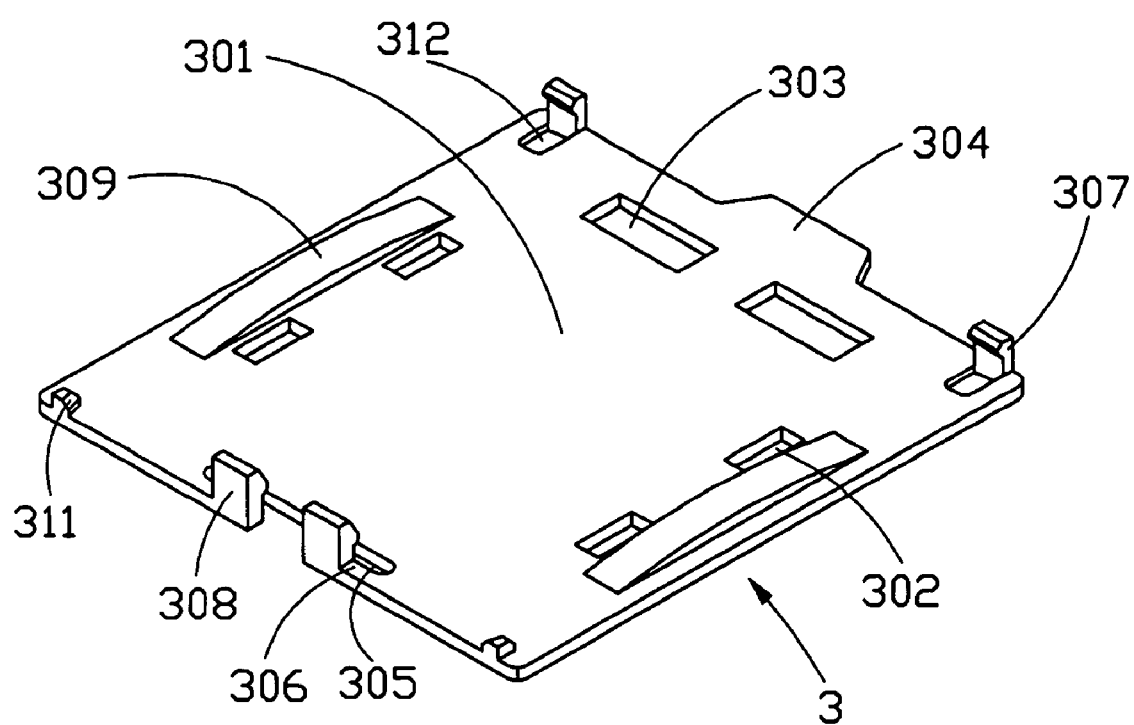
FIG. 2 is an isometric view of the pick-up cap of FIG. 1, but showing the pick-up cap inverted.

FIG. 2 is a view of the pick-up cap 3 inverted. A pair of first clasps 307 is formed at opposite sides of the front end of the planar body 30 respectively. The first clasps 307 depend from the bottom surface 301 of the planar body 30. A recess 312 is defined in a portion of the planar body 30 adjacent a rear of each first clasp 307, thereby increasing a resilience of the first clasp 307. A pair of second clasps 308 is formed at the rear end of the planar body 30. The second clasps 308 depend from free ends of the arms 306 respectively. A pair of protrusions 311 is formed at opposite sides of the rear end of the planar body 30 respectively. The protrusions 311 depend from the bottom surface 301. A pair of parallel arcuate ribs 309 is formed at the opposite lateral sides of the planar body 30 respectively. The ribs 309 depend from the bottom surface 301. The rib 309 defines a downward convex configuration to be compliantly received with the upward concave space (not labeled) which is formed above the downwardly curved configuration of the clip 25.

Figure 3:
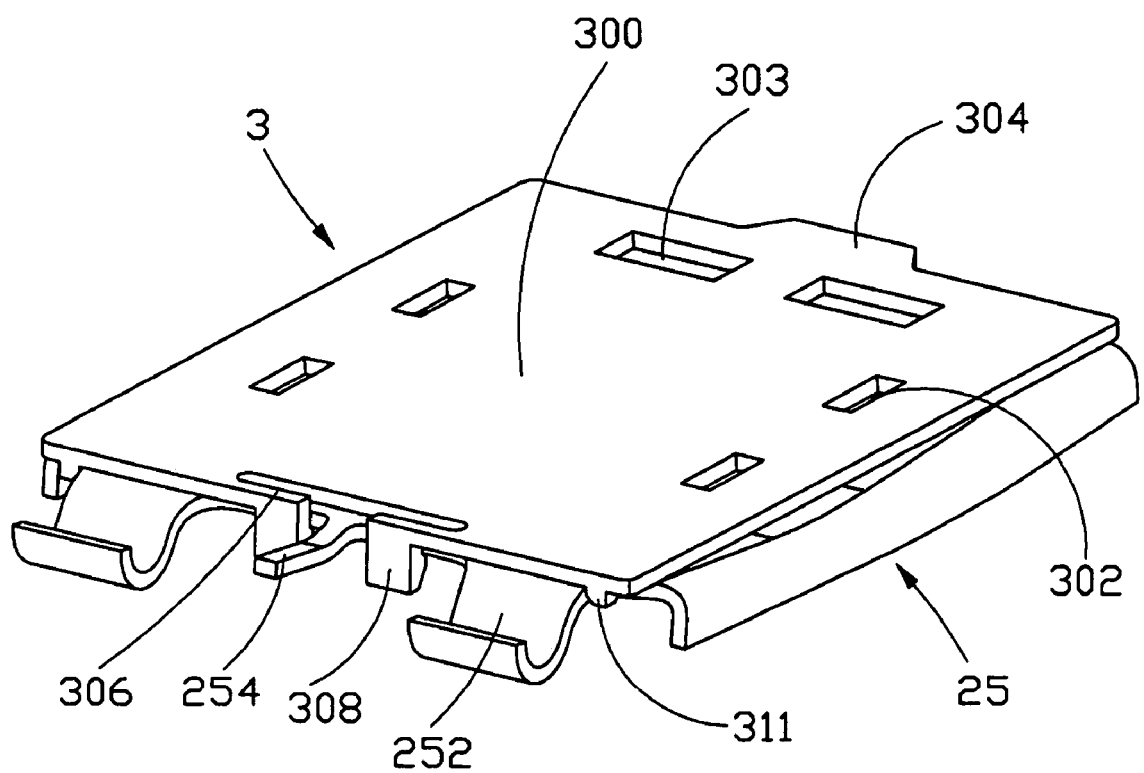
FIG. 3 is an assembled view of the pick-up cap and a clip of the connector of FIG. 1, but viewed from another aspect.
Figure 4:
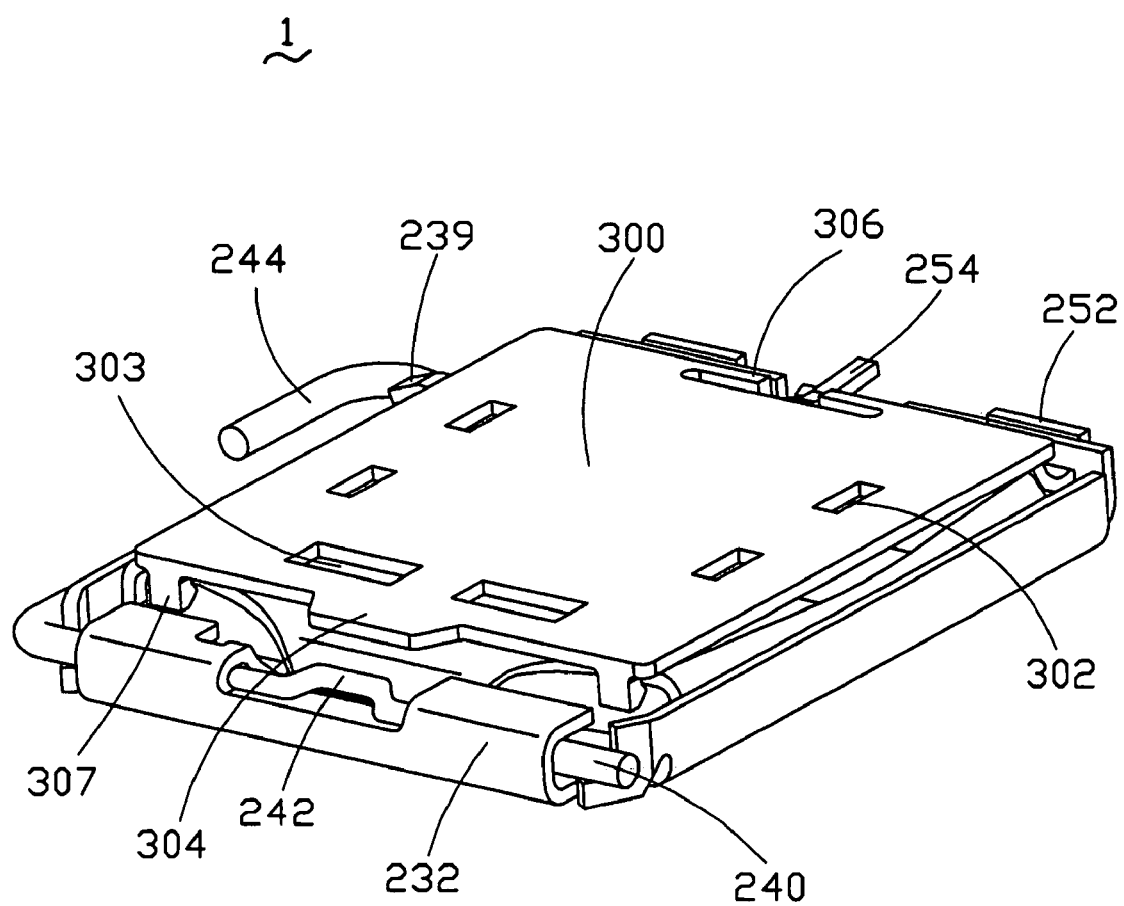
FIG. 4 is an assembled view of FIG. 1.

Referring to FIGS. 3 and 4, in attaching the pick-up cap 3 onto the connector 2, the pick-up cap 3 is disposed over the connector 2, with the first and second clasps 307, 308 loosely contacting corresponding edges of the clip 25 respectively. The pick-up cap 3 is pressed down. The first clasps 307 and second clasps 308 are elastically deflected outwardly. When the ribs 309 of the pick-up cap 3 contact the clip 25 and the channel 305 receives the tail 254 of the clip 25, the first and second clasps 307, -308 snappingly clasp the edges of the clip 25, and the protrusions 311 abut against the corresponding edge of the clip 25. The pick-up cap 3 is thereby securely mounted onto the connector 2. In this position, a vacuum suction device (not shown) can engage the top surface 300 of the pick-up cap 3 in order to move the connector assembly 1 to a desired location on the PCB. At this time, a space is formed between the lip 304 of the pick-up cap 3 and the engaging portion 250 of the clip 25. Therefore, when the pick-up cap 3 is subsequently detached from the connector 2, the user can conveniently pull the lip 304 of the pick-up cap 3 upwardly. The first clasps 307 of the pick-up cap 3 are released from the edge of the clip 25, and then the second clasps 308 are released from the opposite edge of the clip 25. Thus the pick-up cap 3 is easily detached from the connector 2.

As will be appreciated from the foregoing description, the lip 304 of the pick-up cap 3 is integrally formed with the planar body 30, with the planar body 30 and the lip 304 sharing the same top surface 300. Rather than being trapezoidal, the lip 304 may alternatively be configured to be triangular, rectangular or another suitable shape. Whatever shape the lip 304 takes, it not only facilitates detachment of the pick-up cap 3 from the connector 2, but also engagement of the pick-up cap 3 by the vacuum suction device.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A land grid array (LGA) connector assembly, comprising:
   an LGA connector comprising:
   an insulative housing defining a substantially rectangular cavity in a middle thereof, the cavity being adapted for receiving an electronic package therein;
   a plurality of electrical contacts received in a portion of the housing;
   a metal clip disposed on the housing to press the electronic package upon the contacts; and
   a pick-up cap attached to the clip, the pick-up cap having a planar body, and a lip coplanarly formed in the body, for facilitating a user operating the pick-up cap during detachment of the pick-up cap from the clip;
   wherein a plurality of clasps are extended downwardly from two opposite ends of the body;
   wherein the clasps comprises a first clasp and a second clasp;
   wherein the first clasp is formed at a front end of the body, the first clasp depending from the bottom surface of the body and snappingly clasping a corresponding edge of the clip of the connector.

2. The LGA connector assembly as claimed in claim 1, wherein a recess is defined in a portion of the body adjacent a rear of the first clasp.

3. The LGA connector assembly as claimed in claim 1, wherein a T-shaped channel is defined in a middle of a rear end of the body, thereby forming a pair of opposing arms.

4. A land grid array (LGA) connector assembly, comprising:
   an LGA connector comprising:
   an insulative housing defining a substantially rectangular cavity in a middle thereof, the cavity being adapted for receiving an electronic package therein;
   a plurality of electrical contacts received in a portion of the housing;
   a metal clip disposed on the housing to press the electronic package upon the contacts; and
   a pick-up cap attached to the clip, the pick-up cap having a planar body, and a lip coplanarly funned in the body, for facilitating a user operating the pick-up cap during detachment of the pick-up cap from the clip;
   wherein the body has a top surface and a bottom surface opposite to the top surface;
   wherein a pair of protrusions is formed at opposite sides of a rear end of the body respectively, the protrusions depending from the bottom surface and abutting against a corresponding edge of the clip.

5. A land grid array (LGA) connector assembly, comprising:
   an LGA connector comprising:
   an insulative housing defining a substantially rectangular cavity in a middle thereof, the cavity being adapted for receiving an electronic package therein;
   a plurality of electrical contacts received in a portion of the housing;
   a metal clip disposed on the housing to press the electronic package upon the contacts; and
   a pick-up cap attached to the clip, the pick-up cap having a planar body, and a lip coplanarly formed in the body, for facilitating a user operating the pick-up cap during detachment of the pick-up cap from the clip;
   wherein the body has a top surface and a bottom surface opposite to the top surface;
   wherein a pair of parallel arcuate ribs is formed at apposite sides of the body, the ribs depending from the bottom surface of the body.

6. A land grid array (LGA) connector assembly, comprising:
   an LGA connector comprising:
   an insulative housing defining a substantially rectangular cavity in a middle thereof, the cavity being adapted for receiving an electronic package therein;
   a plurality of electrical contacts received in a portion of the housing;
   a metal clip disposed on the housing to press the electronic package upon the contacts; and
   a pick-tip cap attached to the clip, the pick-up cap having a planar body, and a lip coplanarly formed in the body, for facilitating a user operating the pick-up cap during detachment of the pick-up cap from the clip;
   wherein the clip defines a downwardly curved configuration for downwardly pressing the electronic package located in the cavity;
   wherein the pick-up cap defines a convex configuration on the underside to be compliantly received within a concave space formed above the downwardly curved configuration of the clip.

\* \* \* \* \*